(12) United States Patent
Rajsuman et al.

(10) Patent No.: US 6,249,889 B1
(45) Date of Patent: Jun. 19, 2001

(54) METHOD AND STRUCTURE FOR TESTING EMBEDDED MEMORIES

(75) Inventors: Rochit Rajsuman; Hiroaki Yamoto, both of Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/170,179

(22) Filed: Oct. 13, 1998

(51) Int. Cl.⁷ ............................................. G11C 29/00
(52) U.S. Cl. ........................................ 714/718; 714/736
(58) Field of Search ................................ 714/718, 738, 714/736, 30

(56) References Cited

U.S. PATENT DOCUMENTS 5,535,164 * 7/1996 Adams et al. ....................... 365/201
5,617,531 * 4/1997 Crouch et al. ....................... 714/30

* cited by examiner

Primary Examiner—Phung M. Chung
(74) Attorney, Agent, or Firm—Muramatsu & Associates

(57) ABSTRACT

A method and structure for testing embedded memories in an integrated circuit chip having a microprocessor core therein. The method includes the steps of testing the microprocessor core by applying a test pattern and evaluating the resultant output of the microprocessor core, and confirming an integrity of the microprocessor core prior to testing the embedded memory, applying an object code of assembly language test program to the microprocessor core from a source external to the integrated circuit chip, generating a memory test pattern by the microprocessor core based on the object code of the assembly language test program, and applying the memory test pattern to the embedded memory and evaluating the resultant response of the memory by comparing the response with the expected data by the microprocessor core.

7 Claims, 5 Drawing Sheets

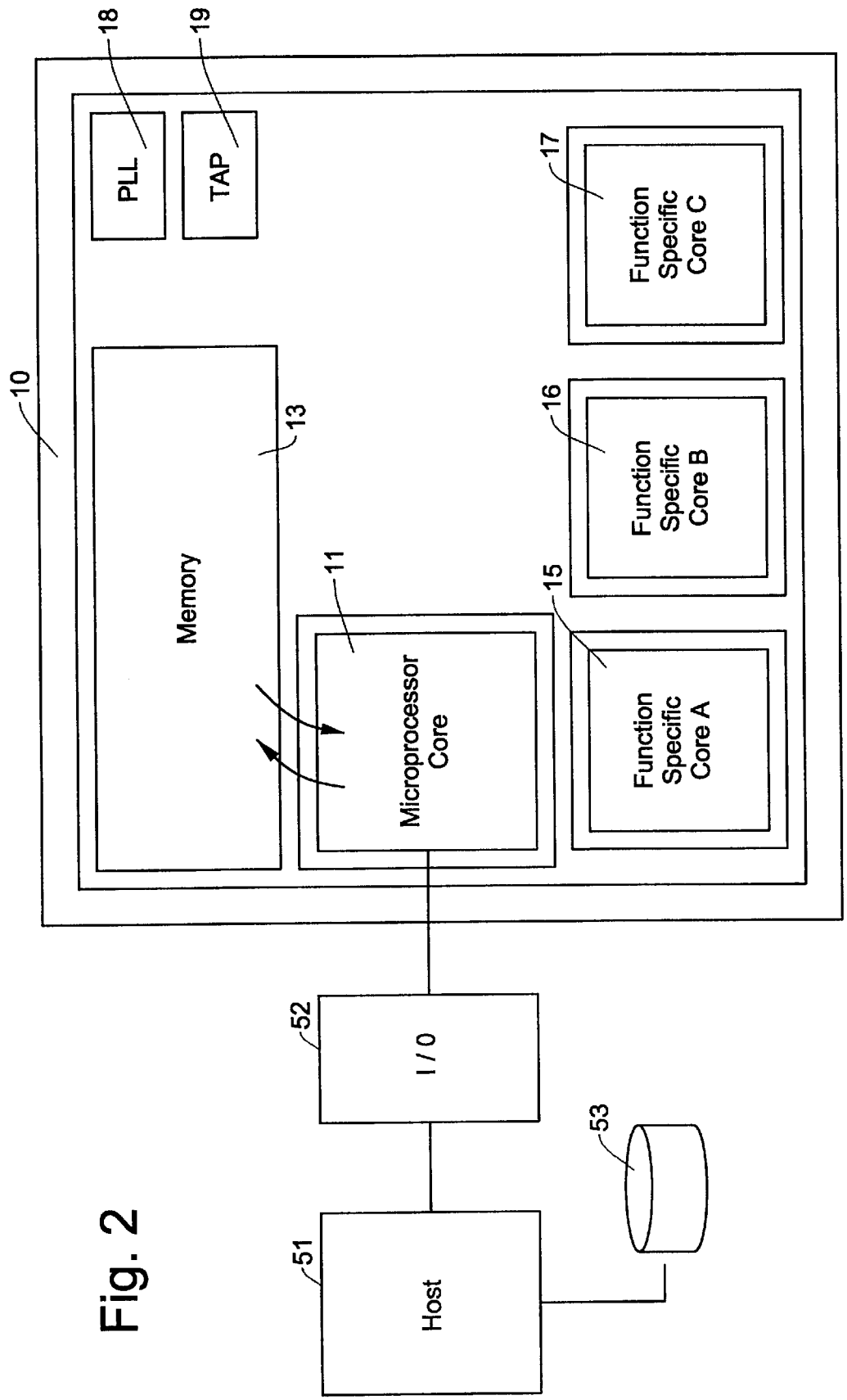

Fig.3A

```
/* Procedure to test embedded RAM*/
/*A0 is address counter, D0 contains test data (write),
D1 is used for read data (response); A0, D0-D2 are
general purpose registers*/

/*Initialization*/
          MOVE 0000H, A0
      /*Initializing address counter*/
          MOVE 0000H, D0
      /*This is data for memory initialization*/
          MOVE 0000H, D2
      /*This will be used to clear memory word after read
*/

/*Test Procedure*/
Initial   MOVE D0, [A0]
      /*The value in D0 is written into location
  addressed by A0*/
          INCR A0
          COMP A0, FFFFH
      /*FFFFH is the last address*/
          BEQ Test_Incr
          BRA Initial
      /*Memory is initialized, Start test*/

/*Write/Read in increasing order*/
Test_Incr MOVE 0000H, A0
          MOVE 5555H, D0
      /*This is test data (0101...)*/
Cont_Incr MOVE D0, [A0]
      /*This is write operation*/
          MOVE [A0], D1
      /*This is read operation*/
          MOVE D2, [A0]
      /*This clears memory word*/
          COMP D0, D1
          BEQ Next_Incr
          BRA Fail
      /*Read data is not 5555H*/
Next_Incr INCR A0
          COMP A0, FFFFH
      /*Last address*/
          BEQ Test_Decr
          BRA Cont_Incr
```

Fig.3B

```
/*Write/Read in decreasing order*/
Test_Decr  MOVE AAAAH, D0
Cont_Decr  MOVE D0, [A0]
       /*This is write operation*/
           MOVE [A0], D1
       /*This is read operation*/
           MOVE D2, [A0]
       /*This clears memory word*/
           COMP D0, D1
           BEQ Next_Decr
           BRA Fail
       /*Read data is not AAAAH*/
Next_Decr  DECR A0
           COMP A0, 0000H
       /*0000H is the last address*/
           BEQ Done
           BRA Cont_Decr Done       Write Test_Passed
Fail       Write Test_Failed
```

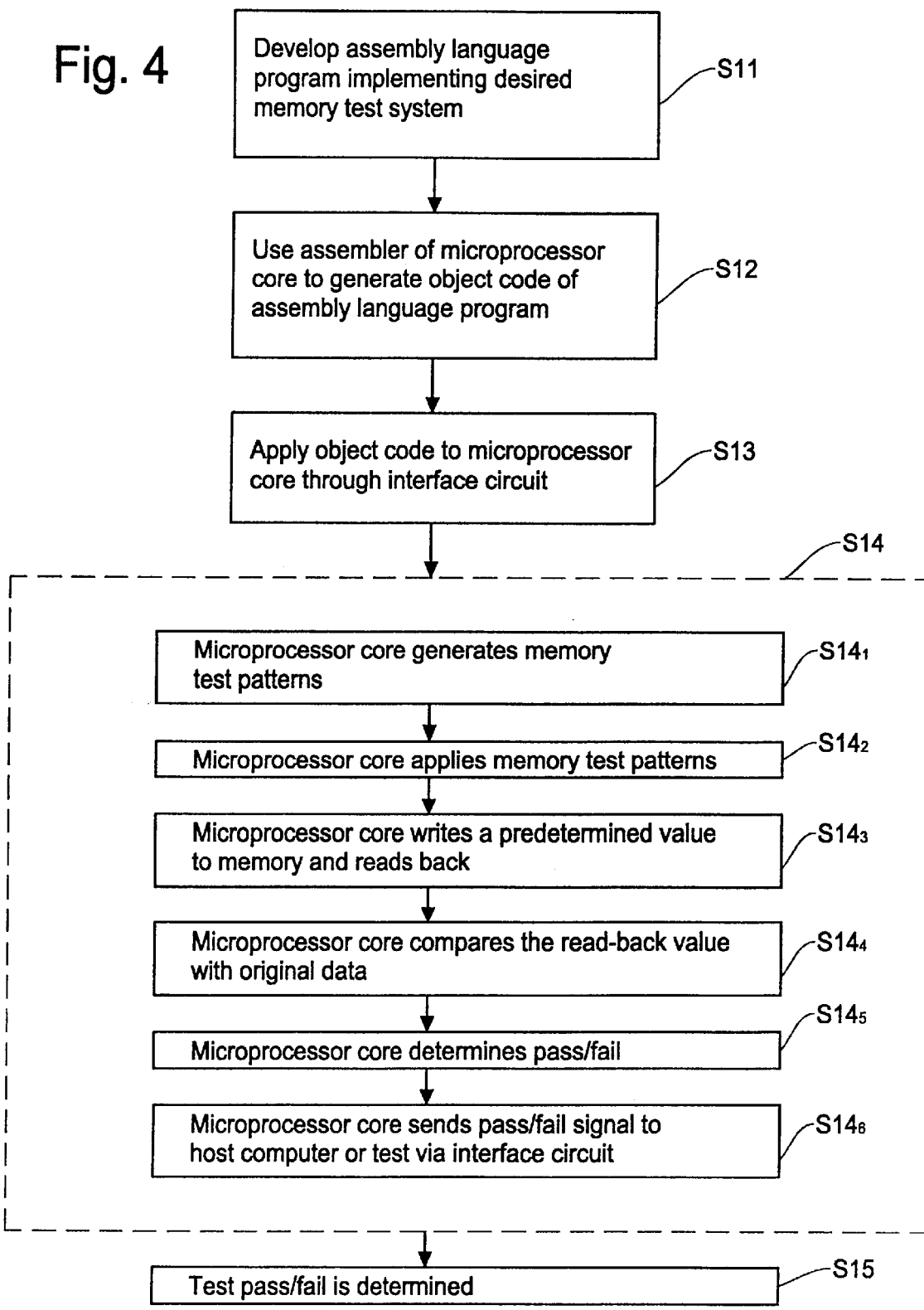

METHOD AND STRUCTURE FOR TESTING EMBEDDED MEMORIES

FIELD OF THE INVENTION

This invention relates to a method for testing memories, and more particularly, to a method and structure for testing embedded memories in a large scale or very large scale integrated circuit (VLSI).

BACKGROUND OF THE INVENTION

In recent several years, ASIC (application specific integrated circuit) technology has evolved from a chip-set philosophy to an embedded core based system-on-a-chip (SoC) concept. An SoC IC includes various reusable blocks or cores, such as microcontrollers, interfaces, memory arrays, and DSPs (digital signal processors). Such functional blocks are commonly called "cores". FIG. 1 is a schematic diagram showing an example of inner structure of such an SoC IC. In the example of FIG. 1, an SoC 10 includes a microprocessor core 11, a memory core 13 and function specific cores 15–17, a PLL core 18, and a test access port (TAP) 19.

Large embedded (on-chip) memories are the key components in SoC ICs. These embedded memories implement register files, FIFOs (first-in-first-out), data-cache, instruction-cache, transmit/receive buffers, storage for texture processing, etc. This invention is directed to a method for testing such embedded (on-chip) memories in an SoC IC. Testing of embedded memories is generally done by one of the following methods:

(1) Direct application of test patterns to an embedded memory under test by an IC tester while accessing the memory through an I/O multiplexing: This method requires modification in the I/Os (input/output) of an SoC by adding a multiplexer therein. Due to this extra multiplexer, there is a permanent penalty, for example, a signal propagation delay, in the performance of the SoC IC. The test patterns are generated by an IC tester's pattern generator such as an ALPG (algorithmic pattern generation) unit. However, due to the multiplexer at the I/Os, the actual test patterns require serialization (parallel to serial conversion) of the ALPG patterns, which increases test complexity, test time and many time losses of at-speed testing.

(2) Test application to an embedded memory under test through local boundary scan or a collar register: This method adds a wrapper (boundary scan or shift-register type wrapper) to an embedded memory to be tested. Thus, the data transfer rate to and from the memory under test slows down by the time equal to the delay of the wrapper. Moreover, during testing, the test patterns are serially shifted-in and response is serially shifted-out. Thus, the test time increases significantly and at-speed testing is not possible.

(3) Memory built-in self-test (BIST): This method requires an additional inner circuit for on-chip test generation and response evaluation. This method is the costliest in terms of hardware overhead (additional chip area). The commercially available memory built-in self-test methods require about 3–4% area overhead for a 16K-bits memory. Also, due to additional circuit parasitic, about 1–2% performance penalty, such as signal propagation delays, occurs in memory read/write operations.

(4) Through ASIC functional test: For some small memory, ASIC vendors include simple write/read operations in the ASIC functional test. Most of the time, 1010 . . . 10 pattern is written and read. Generally, this method is applicable to only small memories and extensive testing is not done by this method.

Because the memory built-in self-test causes very little performance penalty at the chip's I/Os, only about 1–2% penalty in the memory read/write operations and provides an acceptable test time, the memory built-in self-test is increasingly used for embedded memories in system-on-chips. Various types of memory built-in self-test methods are available in the market. However, all the known memory built-in self-test methods are very costly in-terms of hardware overhead and allow only a limited number of memory test algorithms. Another limitation of these methods is that if fault diagnosis is desired, these methods require a significantly large amount of additional hardware to identify the failed bit locations.

As has been foregoing, the conventional test approach using the IC tester or design-for-test scheme is not cost-effective for testing embedded memories in a large scale integrated circuit such as an SoC IC.

SUMMARY OF THE INVENTION

Therefore, it is an object of the present invention to provide a method and structure for testing embedded memories in a large scale integrated circuit (LSI and VLSI), such as a system-on-a-chip (SoC) IC, without requiring any design modification or additional circuit.

It is another object of the present invention to provide a method and structure for testing embedded memories in an SoC IC with no penalty in the performance of the IC.

It is a further object of the present invention to provide a method and structure for testing embedded memories in an SoC IC which allows at-speed testing of embedded memories and facilitates diagnosis.

It is a further object of the present invention to provide a method and structure for testing embedded memories in an SoC IC by providing an assembly language test program which is executed on a microprocessor core in the IC to generates memory test patterns.

It is a further object of the present invention to provide a method and structure for testing embedded memories in an SoC IC with high test efficiency and low cost.

In one aspect of the present invention, the method for testing embedded memories in an integrated circuit having a microprocessor is comprised of the steps of: testing the microprocessor by applying thereto a test pattern and evaluating the resultant output of the microprocessor; applying an object code of an assembly language test program to the microprocessor; generating a memory test pattern by the microprocessor based on the object code of the assembly language test program; applying the memory test pattern to the embedded memory and evaluating the resultant response of the embedded memory by comparing the response with test data applied to the memory.

Another aspect of the present invention is a structure for testing embedded memories. The structure is comprised of: means for testing the microprocessor by applying thereto a random test pattern and evaluating the resultant output of the microprocessor; and a host computer for providing an assembly language test program to the microprocessor through an interface circuit; wherein the embedded memory is provided with a memory test pattern generated by the microprocessor based assembly language test program and the resultant data of the embedded memory is evaluated by the microprocessor.

According to the present invention, no design modification is required and no additional test circuitry is required in the SoC IC. The present invention does not require any design modification in the chip design. There is no performance penalty and the memory is tested at speed. The user can use any memory test algorithm to test embedded memories.

BRIEF DESCRIPTION OF THE DRAWINGS

FIG. 2 is a schematic diagram showing a structure for testing an embedded memory in a system-on-chip IC in accordance with the present invention.

FIGS. 3A and 3B show an example of assembly language test program to be applied to the microprocessor in the SoC IC from an external source.

FIG. 4 is a flow chart showing a process of testing an embedded memory in a system-on-chip IC in accordance with the present invention.

DETAILED DESCRIPTION OF THE PREFERRED EMBODIMENT

Figure 1:
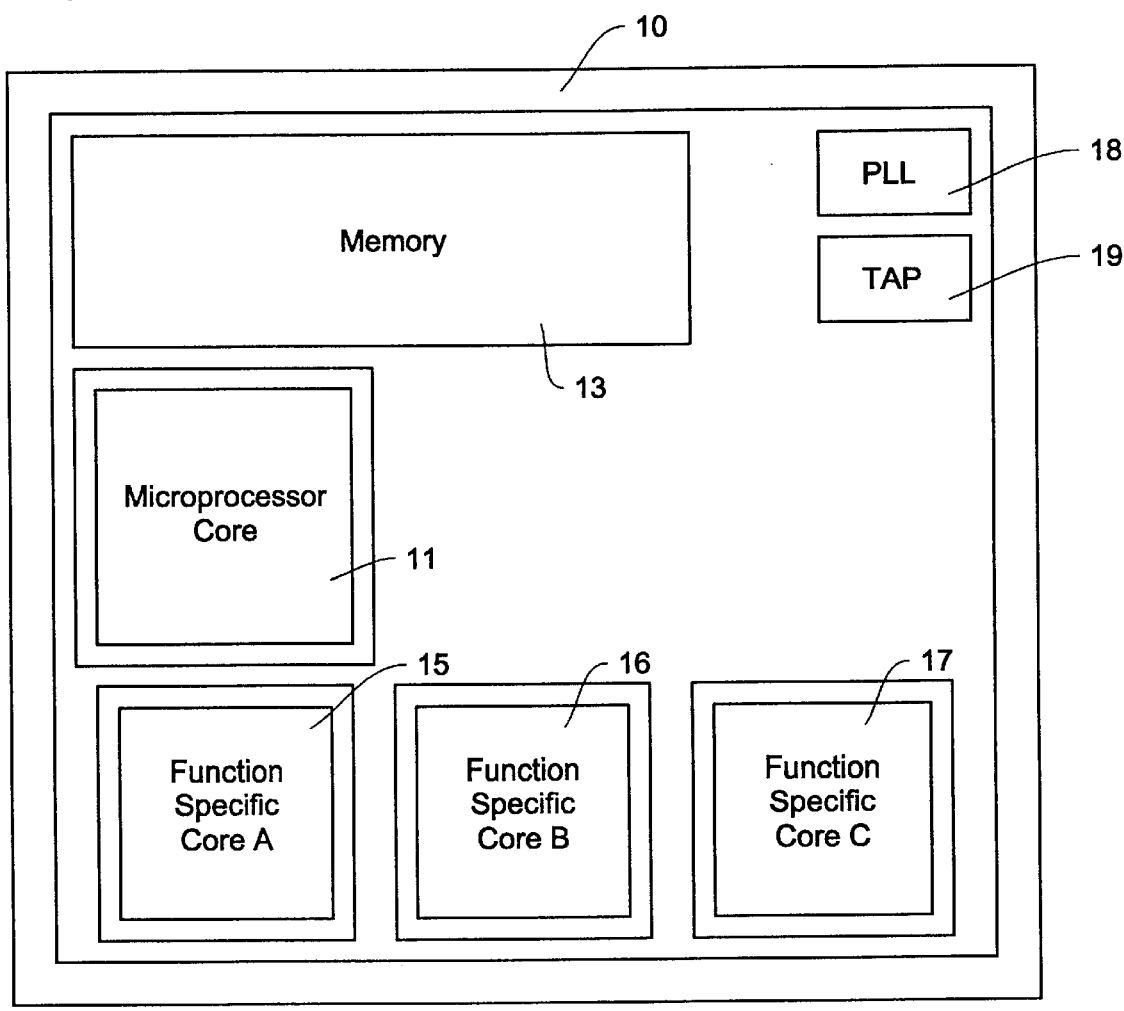
FIG. 1 is a schematic diagram showing an inner structure of a large scale integrated circuit (LSI) which is also called a system-on-chip (SoC) IC having a plurality of embedded cores.

The present invention provides a method for testing an embedded (on-chip) memory in a system-on-a-chip (SoC) IC. Typically, an SoC IC contains one or more microprocessor cores, a memory core, and one or more function-specific cores. In this test method, the computation power of this microprocessor core is utilized to generate memory test patterns, apply the test patterns to the embedded memory and evaluate the test response thereof to determine a fault. This test method does not need any design modification or additional circuit (hardware overhead) as used in the conventional design for-test (DFT) and built-in self-test (BIST) methods.

More specifically, to detect a functional failure of embedded memories in an SoC IC, the test method of the present invention is carried out as follows:

First, the microprocessor core is tested to ensure the correctness of its functionality. A new method for such testing is described in a separate patent application by the same inventors of the present invention.

Second, an assembly language test program is generated. Once the execution of the test in the microprocessor is successful, an assembly language test program is executed on the microprocessor core to generate memory test patterns.

Third, the embedded memory core is tested. The memory test pattern is applied to the embedded memory and the resultant response therefrom is evaluated by the microprocessor core.

As noted above, in the present invention, when the microprocessor core in the SoC IC is tested or its integrity is already known by some other means, the microprocessor core is used as a test pattern generator for the embedded memory. FIG. 2 is a schematic block diagram showing a structure for testing embedded memory by using the embedded microprocessor core whose integrity has been verified. In FIG. 2, a host computer 51, a hard disk 53 and an I/O interface 52 are provided outside of the SoC 10. Typically, the hard disk 53 stores the test program to be used in testing the memory 13. The host computer 51 provides the object code of test program written in an assembly language to the microprocessor core 11 in the SoC chip 10 through the I/O interface 52. A conventional IC tester can also be used to provide the test program to the microprocessor core 11 and to store the test results. However, such a tester may not be necessary and any other means can be used as long as the assembly language test program can be sent to the microprocessor core 11.

The assembly language test program is converted into binary form by the assembler of the microprocessor core 11. This assembler may reside in the host computer or the tester, outside the SoC. Thus, the microprocessor core 11 generates a test pattern from the object code. These test patterns are applied to the memory 13. According to the algorithm of the test pattern, write data is written in the specified addresses of the memory 13. The microprocessor core 11 reads the stored data in the memory 13 to compare the same with the original test data prepared by the microprocessor core 11, which is typically the write data. When the data read from the memory 13 does not match the expected data, failure information and the address information of the memory is sent to the host computer 51.

An example assembly language procedure using simplified memory marching algorithm is shown in FIGS. 3A and 3B. This example uses word-wide read/write operations with 0101 . . . 01 data in increasing order and 1010 . . . 10 in decreasing order, while the size of memory is assumed as 16K×16 RAM.

The marching pattern in FIGS. 3A and 3B is used only for an illustration purpose, the test methodology of the present invention is not limited to it and any algorithm can be used. Examples of other test patterns are a galloping or ping-pong pattern and a checker pattern, and etc.

It should also be noted that the test program as shown in the foregoing may stop as soon as an error occurs. The host computer or IC tester immediately observes the failure and hence, fail-bit location is immediately known. Furthermore, a user can modify the program shown in the above in various ways to collect any desired test information of the embedded memory. In some sense, this method is equivalent to the conventional direct test access mechanism without requiring pin multiplexing and pattern serialization. Because this test method does not require any design modification or hardware overhead for test application or resultant response evaluation, this method can potentially replace the conventional memory BIST method for SoC designs with microprocessor cores.

FIG. 4 is a flow chart showing the operational process of the present invention. In the step S11, an assembly language test program is developed for implementing a desired memory test algorithm. Then an object code of the assembly language test program is generated in the step S12 by using assembler of the microprocessor core 11 within the SoC or of the host computer or tester outside the SoC. Through the interface circuit 52, the object code is applied to the microprocessor core 11 in the step S13.

The step S14 defines the actions by the microprocessor core 11. The step S14 is formed of steps $S14_1$–$S14_6$. The microprocessor core 11 generates memory test patterns in the step $S14_1$ and applies the memory test patterns to the embedded memory 13 in the step $S14_2$. In the step $S14_3$, the microprocessor core 11 writes a predetermined value to the memory 13 and reads back the same. The microprocessor core 11 compares the read-back value with the original data in the step $S14_4$ and determines pass/fail of the memory 13 in the step $S14_5$. Then the microprocessor core 11 sends a pass/fail signal to the host computer or tester via the interface circuit 52. In the last step S15, test pass/fail is determined by the host computer or tester.

The test method of the present invention is different in two fundamental ways from other test methods:

(1) The present invention does not require that the instruction-cache or any other on-chip memory be first tested by the BIST or direct access test method. The invention treats all the on-chip memories equivalently and does not require a known good on-chip memory.

(2) In the present invention, the binary of the assembly language test program is generated off-line using the microprocessor assembler.

The major advantage of the present invention is that no additional test circuitry is required. It does not require any substantial design modification in the chip design. There is no performance penalty and the memory is tested at speed. The user can use any memory test algorithm to test embedded SRAM, DRAM or any kind of memories. The method also provides full fault diagnosis (failed bit location in embedded memory) without any extra hardware.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for testing an embedded memory in an integrated circuit chip having a microprocessor core therein comprising the following steps of:

testing the microprocessor core by applying a test pattern and evaluating the resultant output of the microprocessor core, and confirming an integrity of the microprocessor core prior to testing the embedded memory;

applying an object code of assembly language test program to the microprocessor core from a source external to the integrated circuit chip;

generating a memory test pattern by the microprocessor core based on the object code of the assembly language test program; and applying the memory test pattern to the embedded memory and evaluating the resultant response of the memory by comparing the response with the expected data by the microprocessor core.

2. A method for testing an embedded memory as defined in claim 1, wherein the assembly language test program is provided to the microprocessor core from an external host computer through an I/O interface.

3. A method for testing an embedded memory as defined in claim 1, wherein the assembly language test program is provided to the microprocessor core from an external IC tester through an I/O interface.

4. A structure for testing an embedded memory in an integrated circuit chip having a microprocessor core, comprising:

means for testing the microprocessor core by applying thereto a test pattern and evaluating the resultant output of the microprocessor and confirming integrity of the microprocessor prior to testing the embedded memory;

means for applying an assembly language test program to the microprocessor core for generating a memory test pattern by the microprocessor core; and means for applying the memory test pattern to the embedded memory and evaluating the response of the embedded memory by comparing the response with expected data.

5. A structure for testing an embedded memory as defined in claim 4, wherein the assembly language test program is provided to the microprocessor core from an external host computer through an I/O interface.

6. A structure for testing an embedded memory as defined in claim 4, wherein the assembly language test program is provided to the microprocessor core from an external IC tester through an I/O interface.

7. A structure for testing embedded memory in an integrated circuit chip having a microprocessor core, comprising:

means for testing the microprocessor core by applying thereto a test pattern and evaluating the resultant output of the microprocessor; and a host computer provided outside of the integrated circuit chip for providing an assembly language test program to the microprocessor core through an interface circuit for generating a memory test pattern from the microprocessor core;

wherein the embedded memory is provided with the memory test pattern generated by the microprocessor core that has been tested and integrity of which has been confirmed and the resultant data in the embedded memory is evaluated by the microprocessor core.

* * * * *